(12) United States Patent
Zhang

(10) Patent No.: US 11,024,203 B2
(45) Date of Patent: Jun. 1, 2021

(54) FLEXIBLE DISPLAY DEVICE

(71) Applicant: HUIZHOU CHINA STAR OPTOELECTRONICS TECHNOLOGY CO., LTD., Huizhou Guangdong (CN)

(72) Inventor: Yanxue Zhang, Guangdong (CN)

(73) Assignee: HUIZHOU CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 568 days.

(21) Appl. No.: 15/778,351

(22) PCT Filed: Feb. 5, 2018

(86) PCT No.: PCT/CN2018/075295
§ 371 (c)(1),
(2) Date: May 23, 2018

(87) PCT Pub. No.: WO2019/144435
PCT Pub. Date: Aug. 1, 2019

(65) Prior Publication Data
US 2021/0090474 A1    Mar. 25, 2021

(30) Foreign Application Priority Data
Jan. 29, 2018   (CN) .......................... 201810084859.3

(51) Int. Cl.
*G09F 9/00*     (2006.01)
*G09F 9/30*     (2006.01)
(Continued)

(52) U.S. Cl.
CPC ............ *G09F 9/301* (2013.01); *G06F 1/1635* (2013.01); *G06F 1/1652* (2013.01); *H05K 1/189* (2013.01); *H05K 2201/10128* (2013.01)

(58) Field of Classification Search
CPC ...... G09F 9/301; G06F 1/1635; G06F 1/1652; H05K 1/189; H05K 2201/10128
See application file for complete search history.

(56) References Cited

U.S. PATENT DOCUMENTS 9,870,029 B2 * 1/2018 Kim ...................... G06F 1/1652
10,602,623 B1 * 3/2020 Myers .................... G06F 3/147
(Continued)

FOREIGN PATENT DOCUMENTS

CN         1661431 A    8/2005
CN       102422338 A    4/2012
(Continued)

OTHER PUBLICATIONS

Office Action in CN Application 201810084859.3, dated Jan. 3, 2019, 7pp.

*Primary Examiner* — Pete T Lee
(74) *Attorney, Agent, or Firm* — Leong C. Lei

(57) ABSTRACT

Provided is a flexible display device, comprising a flexible display panel screen and at least one hand held part, wherein each hand held part is connected to an end of the flexible display screen, and each hand held part comprises a housing body and at least one circuit board accommodated in the housing body, and the housing body and the end of the flexible display screen are installed together, and the at least one circuit board is electrically connected with the flexible display screen. The flexible display device utilizes a flexible display screen, and a hand held part is provided at the end of the flexible display screen. When in use, the flexible display screen is unfolded and viewed by the user holding the hand held part. When not in use, the flexible display screen can be curled for easy carrying with no size restriction.

7 Claims, 4 Drawing Sheets

(51) Int. Cl.
*H05K 1/18* (2006.01)
*G06F 1/16* (2006.01)

(56) References Cited

U.S. PATENT DOCUMENTS

| | | | |
|---|---|---|---|
| 2005/0040962 A1 | 2/2005 | Funkhouser et al. | |
| 2014/0362512 A1* | 12/2014 | Hinson | G06F 1/1652 361/679.21 |
| 2015/0009613 A1* | 1/2015 | Morita | G06F 1/1626 361/679.26 |

FOREIGN PATENT DOCUMENTS

| | | | |
|---|---|---|---|
| CN | 102751308 | A | 10/2012 |
| CN | 203457193 | U | 2/2014 |
| CN | 104714699 | A | 6/2015 |
| CN | 107229372 | A | 10/2017 |
| CN | 107393422 | A | 11/2017 |
| CN | 107424519 | A | 12/2017 |
| CN | 107481622 | A | 12/2017 |

* cited by examiner

FLEXIBLE DISPLAY DEVICE

RELATED APPLICATION

The present application is a National Phase of International Application Number PCT/CN2018/075295, filed on Feb. 5, 2018, and claims the priority of China Application No. 2018100848593, filed on Jan. 29, 2018.

FIELD OF THE INVENTION

The present invention relates to a display field, and more particularly to a flexible display device.

BACKGROUND OF THE INVENTION

With the development of display technology, the shapes of the product become more and more abundant. The display screen size of the portable terminal is small, and the display device with a large display screen size is cumbersome and inconvenient to carry.

SUMMARY OF THE INVENTION

For solving the aforesaid issue, the present invention provides a flexible display device.

Provided is a flexible display device, comprising a flexible display panel screen and at least one hand held part, wherein each hand held part is connected to an end of the flexible display screen, and each hand held part comprises a housing body and at least one circuit board accommodated in the housing body, and the housing body and the end of the flexible display screen are installed together, and the at least one circuit board is electrically connected with the flexible display screen.

Furthermore, the housing body comprises a first housing and a second housing, and the first housing is connected with the end of the flexible display screen, and the second housing is fixed to the first housing, and the first housing and the second housing form an accommodating space, and the at least one circuit board is accommodated in the accommodating space.

Furthermore, the first housing is formed with a connection hole penetrating through first housing and the end of the flexible display screen is connected to the at least one circuit board through the connection hole.

Furthermore, each hand held part further comprises an assembling part, and the assembling part is fixed to an inner wall of the first housing, and the end of the flexible display screen is inserted into the accommodating space through the connection hole and is connected with the assembling part.

Furthermore, each hand held part further comprises a fixing part accommodated in the accommodating space, and the assembling part is fixed to the inner wall of the first housing by the fixing part.

Furthermore, each hand held part comprises a plurality of assembling parts, and the plurality of assembling parts are disposed in the first housing at intervals.

Furthermore, a side of the assembling part adjacent to the connection hole and a corresponding end of the flexible display screen are attached together with adhesive.

Furthermore, at least one end of the flexible display screen is provided with a welding area, and the welding area is located in the accommodating space in the corresponding hand held part and is electrically connected to the at least one circuit board.

Furthermore, the second housing is formed with a power supply port penetrating through the second housing.

Furthermore, the at least one circuit board is a flexible circuit board.

Furthermore, the flexible display device further comprises a battery, wherein the battery is received in one of the hand held parts, and the battery is electrically connected with the at least one circuit board and the flexible display screen.

The flexible display device utilizes a flexible display screen, and a hand held part is provided at the end of the flexible display screen. When in use, the flexible display screen is unfolded and viewed by the user holding the hand held part. When not in use, the flexible display screen can be curled for easy carrying with no size restriction.

BRIEF DESCRIPTION OF THE DRAWINGS

In order to more clearly illustrate the embodiments of the present invention, the following figures will be described in the embodiments are briefly introduced. It is obvious that the drawings are some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
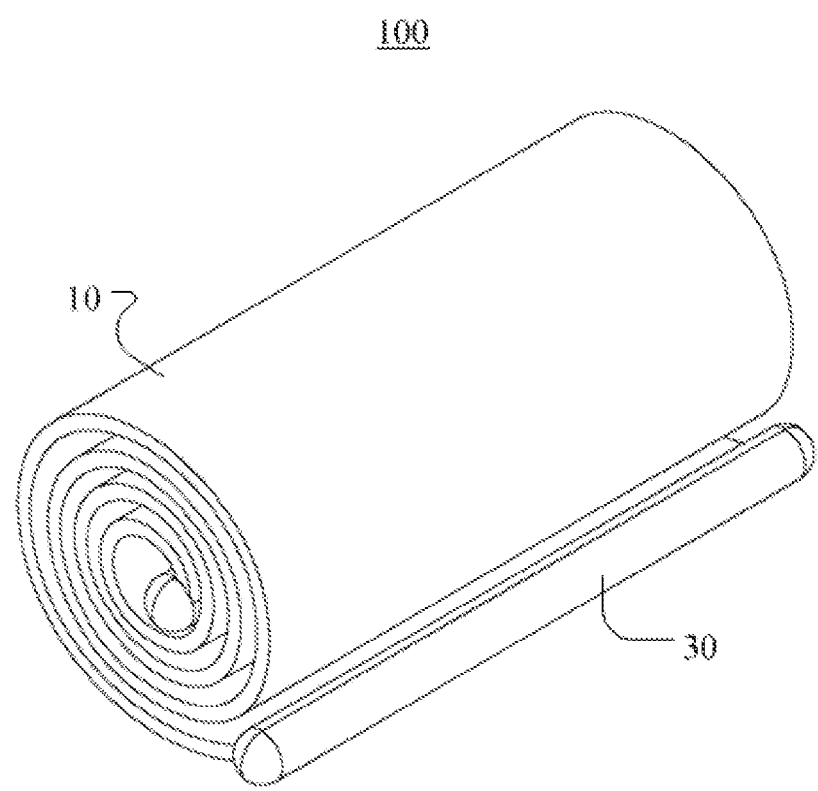
FIG. 1 is a perspective view diagram of a flexible display device in a curled state according to an embodiment of the present invention.
Figure 2:
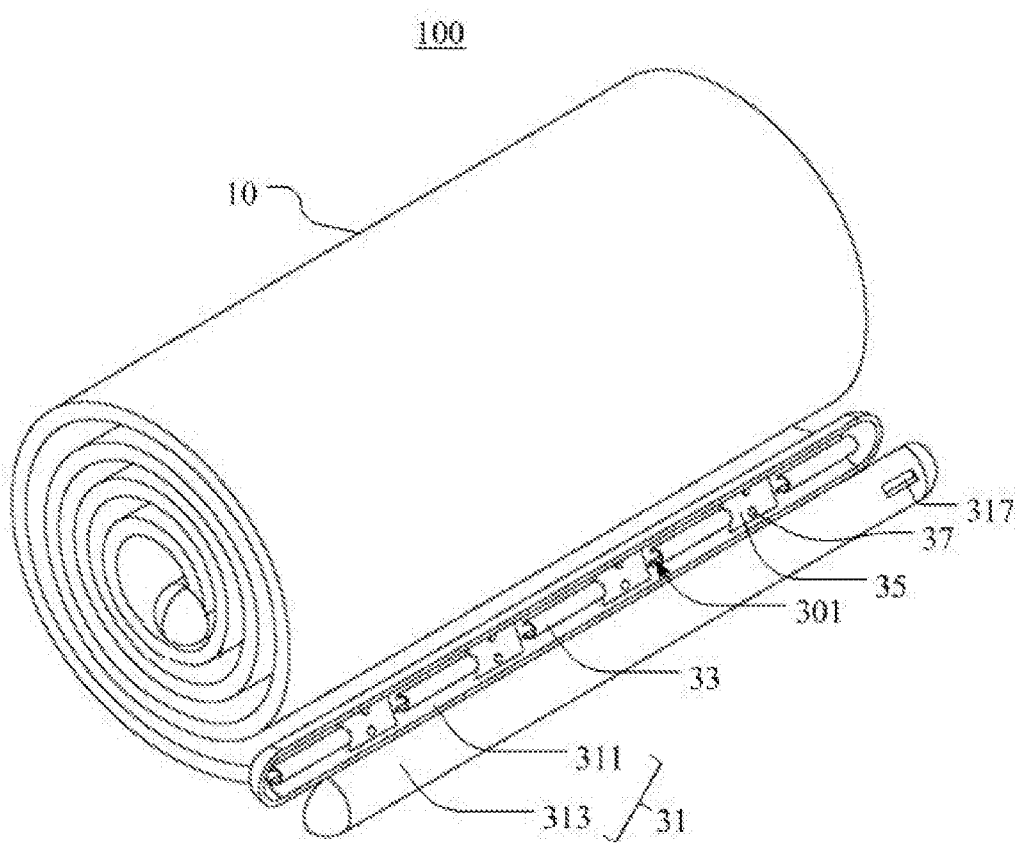
FIG. 2 is a partially exploded perspective view diagram of the flexible display device shown in FIG. 1.

Please refer to FIG. 1 and FIG. 2. FIG. 1 is a perspective view diagram of a flexible display device 100 in a curled state according to an embodiment of the present invention. FIG. 2 is a partially exploded perspective view diagram of the flexible display device 100 shown in FIG. 1. The flexible display device 100 comprises a flexible display panel screen 10 and at least one hand held part 30. Each hand held part 30 and an end of the flexible display screen 10 are installed together. The hand held part 30 comprises a housing body 31 and at least one circuit board 33 accommodated in the housing body 31. The housing body 31 is connected to the end of the flexible display screen 10, correspondingly. The at least one circuit board 33 is electrically connected with the flexible display screen 10.

The flexible display 10 has features of being flexible and foldable, which can meet the dual needs of the user for large screen and portability. For instance, if the flexible display device is in a video playback mode, the flexible display screen 10 can be fully unfolded to obtain a better visual experience. If the flexible display device 100 is in an audio playback mode, the flexible display screen 10 can be completely curled on one hand held part 30 for better portability. If the flexible display device 100 is in a picture or web browsing mode, the flexible display screen 10 can be unfolded with an appropriate length.

In one specific embodiment, the number of the hand held parts 30 is two. One hand held part 30 is installed with the one end of the flexible display screen 10. The other hand held part 30 is installed with the other end of the flexible display screen 10. The hand held part 30 is detachably fixed to the end of the flexible display screen 10.

The housing body 31 is roughly in a shape of strip. The housing body 31 comprises a first housing 311 and a second housing 313. The first housing 311 is connected with the end of the flexible display screen 10, and the second housing 313 is fixed to the first housing 311. The first housing 311 and the second housing 313 form an accommodating space 301, and the at least one circuit board 33 is accommodated in the accommodating space 301.

Figure 3:
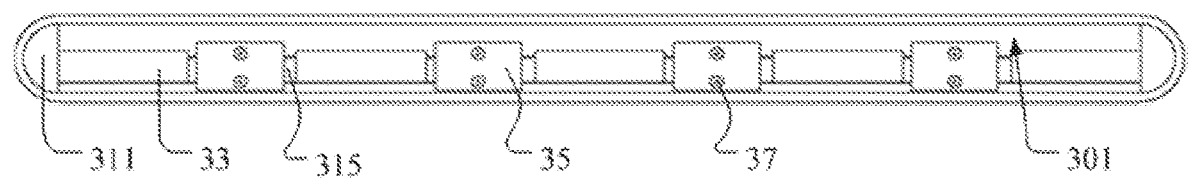
FIG. 3 is a plan view diagram of a hand held part without a second housing.

Further, please refer to FIG. 3. FIG. 3 is a plan view diagram of a hand held part 30 without a second housing 313. The first housing 311 is formed with a connection hole 315 penetrating through first housing and the end of the flexible display screen 10, which is connected to the corresponding end of the hand held part 30, is connected to the at least one circuit board 50 through the connection hole 315.

In this embodiment, the second housing 313 is detachably fixed to the first housing 311 for facilitating disassembly and assembly of the hand held part 30. The second housing 313 is formed with a power supply port 317 penetrating through the second housing (not shown) to allow a power line passing through for connecting the flexible display screen 100 to a power source (not shown).

Furthermore, each hand held part 30 further comprises an assembling part 35 accommodated in the accommodating space. The assembling part 35 is fixed to an inner wall of the first housing 311. One end of the flexible display screen 10 is inserted into the accommodating space 301 through the connection hole 315 and is connected with the assembling part 35. In this embodiment, each hand held part 30 comprises a plurality of assembling parts 35. The plurality of assembling parts 35 is disposed in the first housing 311 at intervals along the length of the first housing 311. A side of the assembling part 35 adjacent to the connection hole 315 and a corresponding end of the flexible display screen 10 are attached together with adhesive.

Furthermore, each hand held part 30 further comprises a fixing part 37. The assembling part 35 is fixed to the inner wall of the first housing 311 by the fixing part 37. In this embodiment, the fixing part 37 is a screw, and the fixing part 37 penetrates the assembling part 35 and is screwed to the inner wall of the first housing 311. It can be understood that the fixing part 37 may be a fixing part, such as a rivet. The assembling part 35 may be fixed with the inner wall of the first housing 311 by riveting.

Furthermore, at least one end of the flexible display screen 10 is provided with a welding area (not shown). The welding area is located in the accommodating space 301 in the corresponding hand held part 30 and is electrically connected to the at least one circuit board 33 in the accommodating space 301.

The at least one circuit board 33 is a flexible circuit board. In this embodiment, the number of circuit boards 33 is plural. It can be understood that the number of the circuit boards 33 is specifically set according to requirements.

As assembling, an end of the flexible display screen 10 is inserted into the accommodating space 301 through the connection hole 315 of the hand held part 30 and is attached with the assembling part 35 with adhesive to electrically connect the end of the flexible display screen 10 with the circuit board 33 of the hand held part 30. Then, the assembly of one end of the flexible display screen 10 and one hand held part 30 is accomplished. In a similar manner, the other end of the flexible display screen 10 is assembled with the other hand held part 30.

Figure 4:
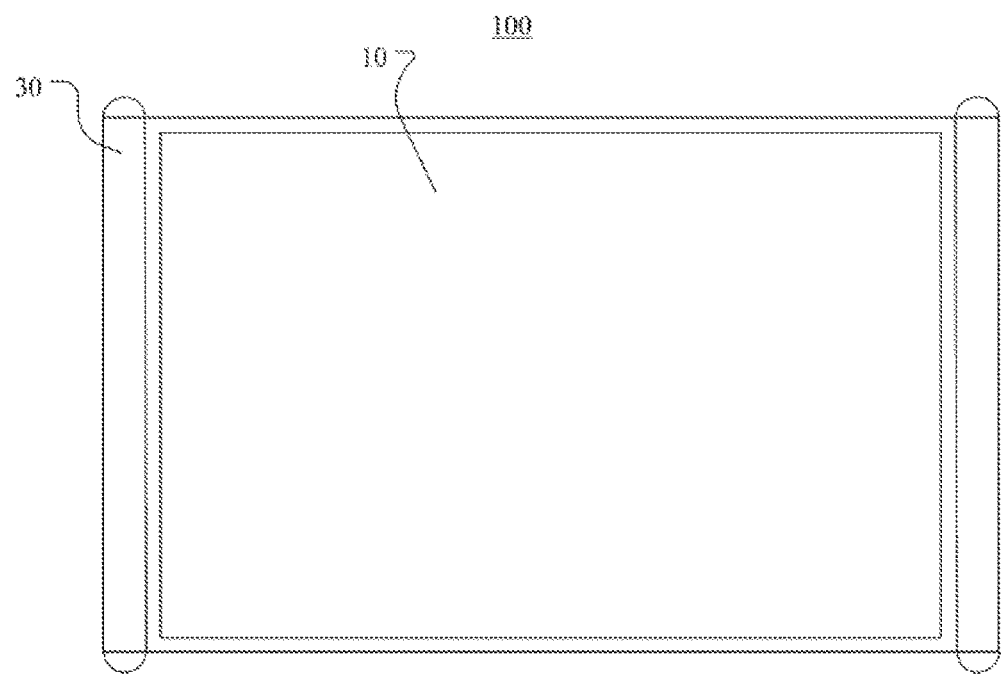
FIG. 4 is a diagram of a flexible display device in an unfolded state according to an embodiment of the present invention.

Please refer to FIG. 4, which is a diagram of a flexible display device 100 in an unfolded state according to an embodiment of the present invention. When the user needs to use the flexible display device 100, for instance, the flexible display device 100 is in a video playback mode, the user holds each hand held part 30 with one hand to fully unfold the flexible display screen 10 to get a large display area.

Please refer to FIG. 1, again. When the user does not need to use the flexible display device 100 to display the content, for instance, the flexible display device 100 is used to play an audio content or the user does not need to use the flexible display device 100, the flexible display device 100 can be curled. In general, the flexible display screen 10 is curled around one of the hand held parts 30 to facilitate storage or carrying.

Certainly, the user can also choose to unfold the flexible display screen 10 with an appropriate length. For instance, the user only needs to watch the display content of a partial area of the flexible display screen 10. The flexible display screen 10 can be partially curled around each hand held part 30 to facilitate viewing.

The flexible display device 100 utilizes a flexible display screen 10, and a hand held part 30 is provided at the end of the flexible display screen 10. When in use, the flexible display screen 10 is unfolded and viewed by the user holding the hand held part 30. When not in use, the flexible display screen can be curled for easy carrying with no size restriction. In addition, the at least one circuit board 33 is concealed in the housing body 31 of the hand held part 30 so that the at least one circuit board 33 is well protected. The service life of the flexible display device 100 is extended. The aesthetic appearance of the flexible display device 100 is described.

It can be understood that the assembling part 35 may be integrally provided with the first housing 311.

Figure 5:
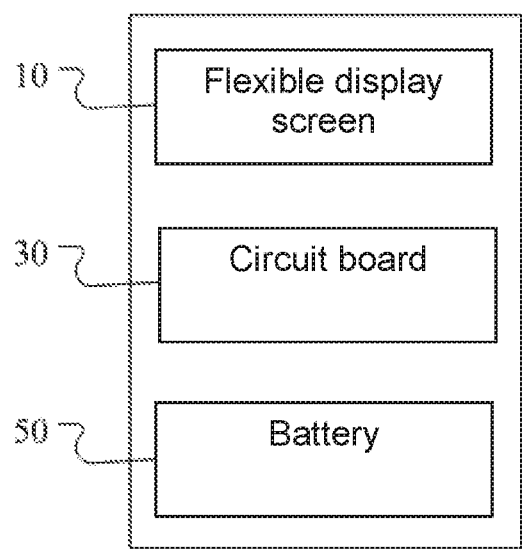
FIG. 5 is a structural block diagram of a flexible display device according to an embodiment of the present invention.

It can be understood that the power supply port 317 on the second housing 313 can be omitted. In one embodiment, as referring to FIG. 5, the flexible display device 100 further comprises a battery 50. The battery 50 is received in one of the hand held parts 30. The battery 50 is electrically connected with the at least one circuit board 33 and the flexible display screen 10 for supplying electrical power to the flexible display screen 10 and other components.

It can be understood that the hand held part 30 can be non-detachably fixed with the end of the flexible display screen 10.

It can be understood that above are embodiments of the present invention, which does not limit the scope of the present invention. Any modifications, equivalent replacements or improvements within the spirit and principles of the embodiment described above should be covered by the protected scope of the invention.

What is claimed is:

1. A flexible display device, comprising a flexible display panel screen and at least one hand held part, wherein each hand held part is connected to an end of the flexible display screen, and each hand held part comprises a housing body and at least one circuit board accommodated in the housing body, and the housing body and the end of the flexible display screen are installed together, and the at least one circuit board is electrically connected with the flexible display screen, wherein the housing body comprises a first housing and a second housing, and the first housing is connected with the end of the flexible display screen, and the second housing is fixed to the first housing, and the first housing and the second housing form an accommodating space, and the at least one circuit board is accommodated in the accommodating space, wherein the first housing is formed with a connection hole penetrating through first housing and the end of the flexible display screen is connected to the at least one circuit board through the connection hole, wherein each hand held part further comprises a plurality of assembling parts, and the plurality of assembling parts are fixed to an inner wall of the first housing, and the end of the flexible display screen is inserted into the accommodating space through the connection hole and is connected with the plurality of assembling parts, and the plurality of assembling parts are disposed in the first housing at intervals.

2. The flexible display device according to claim 1, wherein each hand held part further comprises a fixing part accommodated in the accommodating space, and the assembling part is fixed to the inner wall of the first housing by the fixing part.

3. The flexible display device according to claim 1, wherein a side of the assembling part adjacent to the connection hole and a corresponding end of the flexible display screen are attached together with adhesive.

4. The flexible display device according to claim 1, wherein at least one end of the flexible display screen is provided with a welding area, and the welding area is located in the accommodating space in the corresponding hand held part and is electrically connected to the at least one circuit board.

5. The flexible display device according to claim 1, wherein the second housing is formed with a power supply port penetrating through the second housing.

6. The flexible display device according to claim 1, wherein the at least one circuit board is a flexible circuit board.

7. The flexible display device according to claim 1, further comprising a battery, wherein the battery is received in one of the hand held parts, and the battery is electrically connected with the at least one circuit board and the flexible display screen.

* * * * *